(12) United States Patent
Blin (10) Patent No.: US 8,781,417 B2
(45) Date of Patent: *Jul. 15, 2014

(54) HYBRID TECHNIQUES FOR ANTENNA RETUNING UTILIZING TRANSMIT AND RECEIVE POWER INFORMATION

(71) Applicant: Research In Motion RF, Inc., Wilmington, DE (US)

(72) Inventor: Guillaume Alexandre Blin, Malden, MA (US)

(73) Assignee: BlackBerry Limited, Waterloo, ON (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/886,361

(22) Filed: May 3, 2013

(65) Prior Publication Data

US 2013/0267184 A1 Oct. 10, 2013

Related U.S. Application Data

(63) Continuation of application No. 13/484,343, filed on May 31, 2012, now Pat. No. 8,457,569, which is a continuation of application No. 11/800,592, filed on May 7, 2007, now Pat. No. 8,213,886.

(51) Int. Cl.
*H01Q 11/12* (2006.01)
*H04B 1/04* (2006.01)

(52) U.S. Cl.
USPC ............... 455/123; 455/67.11; 455/67.13; 455/68; 455/69; 455/120; 455/121; 455/124; 455/115.1; 455/115.3; 455/193.1; 455/226.1; 455/226.2

(58) Field of Classification Search
USPC ........... 455/67.11, 67.13–67.16, 68–70, 522, 455/120–126, 115.1–115.4, 226.1–226.4, 455/193.1, 78–82
See application file for complete search history.

(56) References Cited

U.S. PATENT DOCUMENTS

| 2,745,067 A | 5/1956 | True |
| 3,117,279 A | 1/1964 | Ludvigson |
| 3,160,832 A | 12/1964 | Beitman |

(Continued)

FOREIGN PATENT DOCUMENTS

| DE | 19614655 | 10/1997 |
| DE | 102008050743 | 4/2010 |

(Continued)

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

(Continued)

*Primary Examiner* — Tuan A Tran
(74) *Attorney, Agent, or Firm* — Guntin & Gust, PLC; Andrew Gust (57) ABSTRACT

An embodiment of the present invention provides an apparatus, comprising a transceiver, an antenna tuner connecting said transceiver to an antenna, a power sensor adapted to acquire measurements about transmit power, a receive signal strength indicator (RSSI) adapted to acquire measurements about receive power and wherein said tuner tunes said antenna based upon said transmit and receive measurements to optimize said antenna in both the receive and transmit bands.

20 Claims, 4 Drawing Sheets

(56) References Cited

U.S. PATENT DOCUMENTS

| | | | |
|---|---|---|---|
| 3,390,337 | A | 6/1968 | Beitman |
| 3,443,231 | A | 5/1969 | Roza |
| 3,509,500 | A | 4/1970 | McNair |
| 3,571,716 | A | 3/1971 | Hill |
| 3,590,385 | A | 6/1971 | Sabo |
| 3,601,717 | A | 8/1971 | Kuecken |
| 3,742,279 | A | 6/1973 | Kupsky |
| 3,794,941 | A | 2/1974 | Templin |
| 3,919,644 | A | 11/1975 | Smolka |
| 3,990,024 | A | 11/1976 | Hou |
| 3,995,237 | A | 11/1976 | Brunner |
| 4,186,359 | A | 1/1980 | Kaegebein |
| 4,201,960 | A | 5/1980 | Skutta |
| 4,227,256 | A | 10/1980 | O'Keefe |
| 4,383,441 | A | 5/1983 | Willis |
| 4,476,578 | A | 10/1984 | Gaudin |
| 4,493,112 | A | 1/1985 | Bruene |
| 4,777,490 | A | 10/1988 | Sharma |
| 4,799,066 | A | 1/1989 | Deacon |
| 4,965,607 | A * | 10/1990 | Wilkins et al. ............... 343/861 |
| 4,980,656 | A | 12/1990 | Duffalo |
| 5,032,805 | A | 7/1991 | Elmer |
| 5,136,478 | A | 8/1992 | Bruder |
| 5,142,255 | A | 8/1992 | Chang |
| 5,177,670 | A | 1/1993 | Shinohara |
| 5,195,045 | A | 3/1993 | Keane |
| 5,200,826 | A | 4/1993 | Seong |
| 5,212,463 | A | 5/1993 | Babbitt |
| 5,243,358 | A | 9/1993 | Sanford |
| 5,258,728 | A | 11/1993 | Taniyoshi |
| 5,276,912 | A | 1/1994 | Siwiak |
| 5,301,358 | A | 4/1994 | Gaskill |
| 5,307,033 | A | 4/1994 | Koscica |
| 5,310,358 | A | 5/1994 | Johnson |
| 5,312,790 | A | 5/1994 | Sengupta |
| 5,334,958 | A | 8/1994 | Babbitt |
| 5,371,473 | A | 12/1994 | Trinh |
| 5,409,889 | A | 4/1995 | Das |
| 5,427,988 | A | 6/1995 | Sengupta |
| 5,430,417 | A | 7/1995 | Martin |
| 5,446,447 | A | 8/1995 | Carney |
| 5,448,252 | A | 9/1995 | Ali |
| 5,451,567 | A | 9/1995 | Das |
| 5,451,914 | A | 9/1995 | Stengel |
| 5,457,394 | A | 10/1995 | McEwan |
| 5,472,935 | A | 12/1995 | Yandrofski |
| 5,479,139 | A | 12/1995 | Koscica |
| 5,486,491 | A | 1/1996 | Sengupta |
| 5,496,795 | A | 3/1996 | Das |
| 5,502,372 | A | 3/1996 | Quan |
| 5,524,281 | A | 6/1996 | Bradley |
| 5,548,837 | A | 8/1996 | Hess et al. |
| 5,561,407 | A | 10/1996 | Koscica |
| 5,564,086 | A | 10/1996 | Cygan |
| 5,589,844 | A | 12/1996 | Belcher et al. |
| 5,593,495 | A | 1/1997 | Masuda |
| 5,635,433 | A | 6/1997 | Sengupta |
| 5,635,434 | A | 6/1997 | Sengupta |
| 5,640,042 | A | 6/1997 | Koscica |
| 5,679,624 | A | 10/1997 | Das |
| 5,689,219 | A | 11/1997 | Piirainen |
| 5,693,429 | A | 12/1997 | Sengupta |
| 5,694,134 | A | 12/1997 | Barnes |
| 5,699,071 | A | 12/1997 | Urakami |
| 5,721,194 | A | 2/1998 | Yandrofski |
| 5,766,697 | A | 6/1998 | Sengupta |
| 5,777,581 | A | 7/1998 | Lilly |
| 5,778,308 | A | 7/1998 | Sroka |
| 5,786,727 | A | 7/1998 | Sigmon |
| 5,812,572 | A | 9/1998 | King |
| 5,812,943 | A | 9/1998 | Suzuki |
| 5,830,591 | A | 11/1998 | Sengupta |
| 5,846,893 | A | 12/1998 | Sengupta |
| 5,874,926 | A | 2/1999 | Tsuru |
| 5,880,635 | A | 3/1999 | Satoh |
| 5,886,867 | A | 3/1999 | Chivukula |
| 5,892,482 | A | 4/1999 | Coleman et al. |
| 5,929,717 | A | 7/1999 | Richardson |
| 5,963,871 | A | 10/1999 | Zhinong |
| 5,969,582 | A | 10/1999 | Boesch |
| 5,982,099 | A | 11/1999 | Barnes et al. |
| 5,990,766 | A | 11/1999 | Zhang |
| 6,009,124 | A | 12/1999 | Smith |
| 6,020,787 | A | 2/2000 | Kim |
| 6,020,795 | A | 2/2000 | Kim |
| 6,029,075 | A | 2/2000 | Das |
| 6,045,932 | A | 4/2000 | Jia |
| 6,061,025 | A | 5/2000 | Jackson |
| 6,074,971 | A | 6/2000 | Chiu |
| 6,096,127 | A | 8/2000 | Dimos |
| 6,100,733 | A | 8/2000 | Dortu |
| 6,101,102 | A | 8/2000 | Brand |
| 6,115,585 | A | 9/2000 | Matero |
| 6,125,266 | A | 9/2000 | Matero et al. |
| 6,133,883 | A | 10/2000 | Munson |
| 6,172,385 | B1 | 1/2001 | Duncombe |
| 6,215,644 | B1 | 4/2001 | Dhuler |
| 6,242,989 | B1 | 6/2001 | Barber |
| 6,281,748 | B1 | 8/2001 | Klomsdorf et al. |
| 6,281,847 | B1 | 8/2001 | Lee |
| 6,309,895 | B1 | 10/2001 | Jaing |
| 6,343,208 | B1 | 1/2002 | Ying |
| 6,377,142 | B1 | 4/2002 | Chiu |
| 6,377,217 | B1 | 4/2002 | Zhu |
| 6,377,440 | B1 | 4/2002 | Zhu |
| 6,384,785 | B1 | 5/2002 | Kamogawa |
| 6,404,614 | B1 | 6/2002 | Zhu |
| 6,408,190 | B1 | 6/2002 | Ying |
| 6,414,562 | B1 | 7/2002 | Bouisse |
| 6,415,562 | B1 | 7/2002 | Donaghue |
| 6,452,776 | B1 | 9/2002 | Chakravorty |
| 6,461,930 | B2 | 10/2002 | Akram |
| 6,466,774 | B1 | 10/2002 | Okabe |
| 6,492,883 | B2 | 12/2002 | Liang |
| 6,514,895 | B1 | 2/2003 | Chiu |
| 6,525,630 | B1 | 2/2003 | Zhu |
| 6,531,936 | B1 | 3/2003 | Chiu |
| 6,535,076 | B2 | 3/2003 | Partridge |
| 6,535,722 | B1 | 3/2003 | Rosen |
| 6,538,603 | B1 | 3/2003 | Chen |
| 6,556,102 | B1 | 4/2003 | Sengupta |
| 6,556,814 | B1 | 4/2003 | Klomsdorf |
| 6,570,462 | B2 | 5/2003 | Edmonson |
| 6,590,468 | B2 | 7/2003 | du Toit |
| 6,590,541 | B1 | 7/2003 | Schultze |
| 6,597,265 | B2 | 7/2003 | Liang |
| 6,608,603 | B2 | 8/2003 | Alexopoulos |
| 6,624,786 | B2 | 9/2003 | Boyle |
| 6,640,085 | B1 | 10/2003 | Chatzipetros |
| 6,657,595 | B1 | 12/2003 | Phillips et al. |
| 6,661,638 | B2 | 12/2003 | Jackson et al. |
| 6,670,256 | B2 | 12/2003 | Yang |
| 6,710,651 | B2 | 3/2004 | Forrester |
| 6,724,611 | B1 | 4/2004 | Mosley |
| 6,724,890 | B1 | 4/2004 | Bareis |
| 6,737,179 | B2 | 5/2004 | Sengupta |
| 6,759,918 | B2 | 7/2004 | du Toit |
| 6,765,540 | B2 | 7/2004 | Toncich |
| 6,768,472 | B2 | 7/2004 | Alexopoulos |
| 6,774,077 | B2 | 8/2004 | Sengupta |
| 6,795,712 | B1 | 9/2004 | Vakilian |
| 6,825,818 | B2 | 11/2004 | Toncich |
| 6,839,028 | B2 | 1/2005 | Lee |
| 6,845,126 | B2 | 1/2005 | Dent |
| 6,859,104 | B2 | 2/2005 | Toncich |
| 6,862,432 | B1 | 3/2005 | Kim |
| 6,864,757 | B2 | 3/2005 | Du Toit |
| 6,868,260 | B2 | 3/2005 | Jagielski |
| 6,875,655 | B2 | 4/2005 | Lin |
| 6,888,714 | B2 | 5/2005 | Shaw |
| 6,905,989 | B2 | 6/2005 | Ellis |
| 6,907,234 | B2 | 6/2005 | Karr |
| 6,920,315 | B1 | 7/2005 | Wilcox et al. |
| 6,922,330 | B2 | 7/2005 | Nielsen |

(56) References Cited

U.S. PATENT DOCUMENTS

| | | |
|---|---|---|
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 * | 12/2008 | Tsai et al. ............ 331/126 |
| 7,469,129 B2 | 12/2008 | Blaker et al. |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 * | 5/2009 | Jang et al. ............ 455/575.3 |
| 7,557,507 B2 | 7/2009 | Wu |
| 7,596,357 B2 * | 9/2009 | Nakamata et al. ........... 455/78 |
| 7,633,355 B2 | 12/2009 | Matsuo |
| 7,642,879 B2 | 1/2010 | Matsuno |
| 7,655,530 B2 | 2/2010 | Hosking |
| 7,667,663 B2 | 2/2010 | Hsiao |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,768,400 B2 | 8/2010 | Lawrence et al. |
| 7,786,819 B2 | 8/2010 | Ella |
| 7,795,990 B2 | 9/2010 | du Toit |
| 7,852,170 B2 | 12/2010 | McKinzie |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,217,732 B2 | 7/2012 | McKinzie |
| 8,299,867 B2 | 10/2012 | McKinzie |
| 8,320,850 B1 | 11/2012 | Khlat |
| 8,442,457 B2 | 5/2013 | Harel et al. |
| 8,472,888 B2 | 6/2013 | Manssen et al. |
| 2002/0008672 A1 | 1/2002 | Griffin |
| 2002/0030566 A1 | 3/2002 | Bozler |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling et al. |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | D du Toit |
| 2003/0210206 A1 | 11/2003 | Phillips |
| 2003/0232607 A1 * | 12/2003 | Le Bars et al. ............ 455/126 |
| 2004/0009754 A1 * | 1/2004 | Smith, Jr. ............ 455/82 |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0232982 A1 | 11/2004 | Ichitsubo et al. |
| 2004/0257293 A1 | 12/2004 | Friedrich |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0264455 A1 | 12/2005 | Talvitie |
| 2005/0282503 A1 | 12/2005 | Onno |
| 2006/0003537 A1 | 1/2006 | Sinha |
| 2006/0009165 A1 * | 1/2006 | Alles ............ 455/88 |
| 2006/0099915 A1 | 5/2006 | Laroia et al. |
| 2006/0160501 A1 | 7/2006 | Mendolia |
| 2006/0183433 A1 | 8/2006 | Mori et al. |
| 2006/0183442 A1 | 8/2006 | Chang et al. |
| 2006/0205368 A1 | 9/2006 | Bustamante |
| 2006/0281423 A1 | 12/2006 | Caimi |
| 2007/0013483 A1 | 1/2007 | Stewart |
| 2007/0035458 A1 | 2/2007 | Isao |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0111681 A1 | 5/2007 | Alberth et al. |
| 2007/0142014 A1 | 6/2007 | Wilcox |
| 2007/0149146 A1 | 6/2007 | Hwang |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie et al. |
| 2007/0200766 A1 | 8/2007 | McKinzie |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0055016 A1 | 3/2008 | Morris |
| 2008/0081670 A1 | 4/2008 | Rofougaran |
| 2008/0090539 A1 | 4/2008 | Thompson |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Blin |
| 2008/0274706 A1 | 11/2008 | Blin |
| 2008/0280570 A1 | 11/2008 | Blin |
| 2008/0300027 A1 | 12/2008 | Dou |
| 2008/0305749 A1 | 12/2008 | Ben-Bassat |
| 2009/0002077 A1 | 1/2009 | Rohani et al. |
| 2009/0027286 A1 | 1/2009 | Ohishi |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |

(56) References Cited

U.S. PATENT DOCUMENTS

| | | |
|---|---|---|
| 2009/0215446 A1 | 8/2009 | Hapsari et al. |
| 2009/0231220 A1 | 9/2009 | Yang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0073103 A1 | 3/2010 | Spears et al. |
| 2010/0085260 A1 | 4/2010 | McKinzie |
| 2010/0105425 A1 | 4/2010 | Asokan |
| 2010/0156552 A1 | 6/2010 | McKinzie |
| 2010/0164640 A1 | 7/2010 | McKinzie |
| 2010/0164641 A1 | 7/2010 | McKinzie |
| 2010/0232474 A1 | 9/2010 | Rofougaran |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0012790 A1 | 1/2011 | Badaruzzaman |
| 2011/0014879 A1 | 1/2011 | Alberth et al. |
| 2011/0014886 A1 | 1/2011 | Manssen |
| 2011/0043298 A1 | 2/2011 | McKinzie |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0121079 A1 | 5/2011 | Lawrence et al. |
| 2011/0133994 A1 | 6/2011 | Korva |
| 2011/0183628 A1 | 7/2011 | Baker |
| 2011/0183633 A1 | 7/2011 | Isao |
| 2011/0227666 A1 | 9/2011 | Manssen |
| 2011/0237207 A1 | 9/2011 | Bauder |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0299438 A1 | 12/2011 | Mikhemar |
| 2012/0051409 A1 | 3/2012 | Brobston et al. |
| 2012/0075159 A1 | 3/2012 | Chang |
| 2012/0094708 A1 | 4/2012 | Park |
| 2012/0100802 A1 | 4/2012 | Mohebbi |
| 2012/0112851 A1 | 5/2012 | Manssen |
| 2012/0154975 A1 | 6/2012 | Oakes |
| 2012/0214421 A1 | 8/2012 | Hoirup |
| 2012/0243579 A1 | 9/2012 | Premakanthan et al. |
| 2012/0295554 A1 | 11/2012 | Greene |

FOREIGN PATENT DOCUMENTS

| | | |
|---|---|---|
| EM | EP0909024 | 4/1999 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2328233 | 6/2011 |
| EP | 2388925 A1 | 11/2011 |
| EP | 2424119 A1 | 2/2012 |
| JP | 03276901 | 3/1990 |
| JP | 02-077580 | 9/1991 |
| JP | 9321526 | 12/1997 |
| JP | 10209722 | 8/1998 |
| JP | 2000124066 | 4/2000 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | 2009/064968 | 5/2009 |
| WO | 2009/155966 | 12/2009 |
| WO | 2011/044592 | 4/2011 |
| WO | 2011/084716 | 7/2011 |
| WO | 2011/133657 | 10/2011 |
| WO | 2011028453 | 10/2011 |
| WO | 2012/067622 | 5/2012 |
| WO | 2012/085932 | 6/2012 |

OTHER PUBLICATIONS

Du Toit, , "Tunable Microwave Devices With Auto Adjusting Matching Circuit", U.S. Appl. No. 13/302,617, filed Nov. 22, 2011.

Du Toit, , "Tunable Microwave Devices With Auto-Adjusting Matching Circuit", U.S. Appl. No. 13/302,649, filed Nov. 22, 2011.

Eiji, N. , "High-Frequency Circuit and Its Manufacture", Patent Abstracts of Japan, vol. 1998, No. 13, Nov. 30, 1998 & JP 10 209722 A (Seiko Epson Corp), Aug. 7, 1998.

Greene, , "Method and Apparatus for Tuning a Communication Device", U.S. Appl. No. 13/108,463, filed May 16, 2011.

Greene, , "Method and Apparatus for Tuning a Communication Device", U.S. Appl. No. 13/108,589, filed May 16, 2011.

Hoirup, , "Method and Apparatus for Radio Antenna Frequency Tuning", U.S. Appl. No. 13/030,177, filed Feb. 18, 2011.

Huang, Libo et al., "Theoretical and experimental investigation of adaptive antenna impedance matching for multiband mobile phone applications", IEEE, Sep. 7, 2005, 13-17.

Hyun, S. , "Effects of strain on the dielectric properties of tunable dielectric SrTi03 thin films", Applied Physics Letters, vol. 79, No. 2, Jul. 9, 2001.

Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.

Katsuya, K. , "Hybrid Integrated Circuit Device", Patent Abstracts of Japan, Publication No. 03-276901, Date of publication of application: Sep. 12, 1991.

Manssen, , "Method and Apparatus for Managing Interference in a Communication Device", U.S. Appl. No. 61/326,206, filed Apr. 20, 2010.

Manssen, , "Method and Apparatus for Tuning Antennas in a Communication Device", U.S. Appl. No. 12/941,972, filed Nov. 8, 2010.

Manssen, , "Method and Apparatus for Tuning Antennas in a Communication Device", U.S. Appl. No. 13/005,122, filed Jan. 12, 2011.

McKinzie, , "Adaptive Impedance Matching Module (AIMM) Control Architectures", U.S. Appl. No. 13/293,544, filed Nov. 10, 2011.

McKinzie, , "Adaptive Impedance Matching Module (AIMM) Control Architectures", U.S. Appl. No. 13/293,550, filed Nov. 10, 2011.

McKinzie, , "Method and Apparatus for Adaptive Impedance Matching", U.S. Appl. No. 13/217,748, filed Aug. 25, 2011.

Mendolia, "Method and Apparatus for Tuning a Communication Device", U.S. Appl. No. 13/035,417, filed Feb. 25, 2011.

Paratek Microwave, Inc., , "Method and Appartus for Tuning Antennas in a Communication Device", International Application No. PCT/US11/59620; Filed Nov. 7, 2011.

Patent Cooperation Treaty, "International Search Report and Written Opinion", International Application No. PCT/US2010/046241, Mar. 2, 2011.

Patent Cooperation Treaty, "International Search Report and Written Opinion", International Application No. PCT/US2010/056413, Jul. 27, 2011.

Patent Cooperation Treaty, "International Search Report and Written Opinion", Nov. 16, 2011, International Application No. PCT/US/2011/038543.

Patent Cooperation Treaty, , "International Search Report and Written Opinion", PCT Application No. PCT/US08/005085, Jul. 2, 2008.

Pervez, N.K. , "High Tunability barium strontium titanate thin films for RF circuit applications", Applied Physics Letters, vol. 85, No. 19, Nov. 8, 2004.

Petit, Laurent , "MEMS-Switched Parasitic-Antenna Array for Radiation Pattern Diversity", IEEE Transactions on Antennas and Propagation, vol. 54, No. 9, Sep. 2009, 2624-2631.

Qiao, et al., "Antenna Impedance Mismatch Measurement and Correction for Adaptive COMA Transceivers", IEEE, Jan. 2005.

Qiao, et al., "Measurement of Antenna Load Impedance for Power Amplifiers", The Department of Electrical and Computer Engineering, University of California, San Diego, Sep. 13, 2004.

(56) References Cited

OTHER PUBLICATIONS

Spears, , "Methods for Tuning an Adaptive Impedance Matching Network With a Look-Up Table", U.S. Appl. No. 13/297,951, filed Nov. 16, 2011.

Stemmer, Susanne , "Low-loss tunable capacitors fabricated directly on gold bottom electrodes", Applied Physics Letters 88, 112905, Mar. 15, 2006.

Taylor, T.R. , "Impact of thermal strain on the dielectric constant of sputtered barium strontium titanate thin films", Applied Physics Letters, vol. 80, No. 11, Mar. 18, 2002.

Tombak, Ali , "Tunable Barium Strontium Titanate Thin Film Capacitors for RF and Microwave Applications", IEEE Microwave and Wireles Components Letters, vol. 12, Jan. 2002.

Xu, Hongtao , "Tunable Microwave Integrated Circuits using BST Thin Film Capacitors with Device", Integrated Ferroelectrics, Department of Electrical Engineering and Computer Engineering, University of California, 2005, Apr. 2005.

Zuo, S. , "Eigenmode Decoupling for Mimo Loop-Antenna Based on 180 Coupler", Progress in Electromagnetics Research Letters, vol. 26, Aug. 2011, 11-20.

\* cited by examiner

HYBRID TECHNIQUES FOR ANTENNA RETUNING UTILIZING TRANSMIT AND RECEIVE POWER INFORMATION

CROSS-REFERENCE TO RELATED APPLICATIONS

This application is a continuation of and claims priority to U.S. patent application Ser. No. 13/484,343, filed May 31, 2012, which is a continuation of U.S. patent application Ser. No. 11/800,592, filed May 7, 2007 now U.S. Pat. No. 8,213,886, the disclosures of all of which are incorporated herein by reference in their entirety.

BACKGROUND OF THE INVENTION

Wireless devices have become prevalent throughout society. As users demand more mobility, there is a tremendous requirement for decreasing power consumption and thereby increasing battery life. Further, many wireless devices may transmit on a plurality of carrier frequencies and include circuits dealing with several frequency bands of operation and may receive and transmit at varying power levels. In wireless applications, the transmitted power is much higher than the received power and to perform the retuning of a mismatched antenna or matching network, power measurement must be performed.

Thus, there is a strong need for techniques for antenna retuning utilizing transmit and receive power information.

SUMMARY OF THE INVENTION

An embodiment of the present invention provides an apparatus, comprising a transceiver, an antenna tuner connecting the transceiver to an antenna, a power sensor adapted to acquire measurements about transmit power, a receive signal strength indicator (RSSI) adapted to acquire measurements about receive power and wherein the tuner tunes the antenna based upon the transmit and receive measurements to optimize the antenna in both the receive and transmit bands.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities; and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

Figure 1:
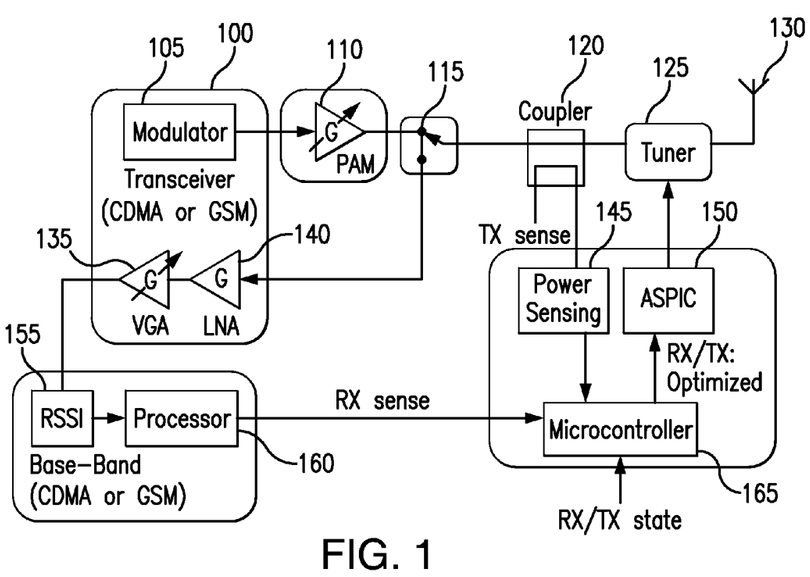
FIG. 1 illustrates an apparatus adapted for transmit and receive fully closed loop power measurements and antenna retuning of an embodiment of the present invention.

Turning to FIG. 1, is an apparatus, comprising a transceiver 100, an antenna tuner 125 connecting the transceiver 100 to an antenna 130, a power sensor 145 adapted to acquire measurements about transmit power, a receive signal strength indicator (RSSI) 155 adapted to acquire measurements about receive power, and wherein the tuner 125 tunes the antenna 130 based upon the transmit and receive measurements to optimize the antenna 130 in both the receive and transmit bands.

In an embodiment of the present invention, the transceiver may further comprise a modulator 105 driving a variable power amplifier module (PAM) 110 and a low noise amplifier 140 adapted to receive the output of the variable PAM 110 via a switch 115, and a variable gain amplifier (VGA) 135 receiving the output of the low noise amplifier 140. The RSSI may receive the output of the VGA and output it to a processor 160, thereby providing the receive sense for the receive signal measurements. The output of the PAM 110 may be coupled via a coupler. 120 and switch 115 to the power sensor 145 to determine the transmit measurements. In an embodiment of the present invention the apparatus may further comprise a microcontroller 165 adapted to received transmit measurements from the power sensor 145 and receive measurements from the RSSI 155 via a processor 160 and pass this information to an application specific programmable integrated circuit (ASPIC) 150 to control the tuner 125.

Figure 2:
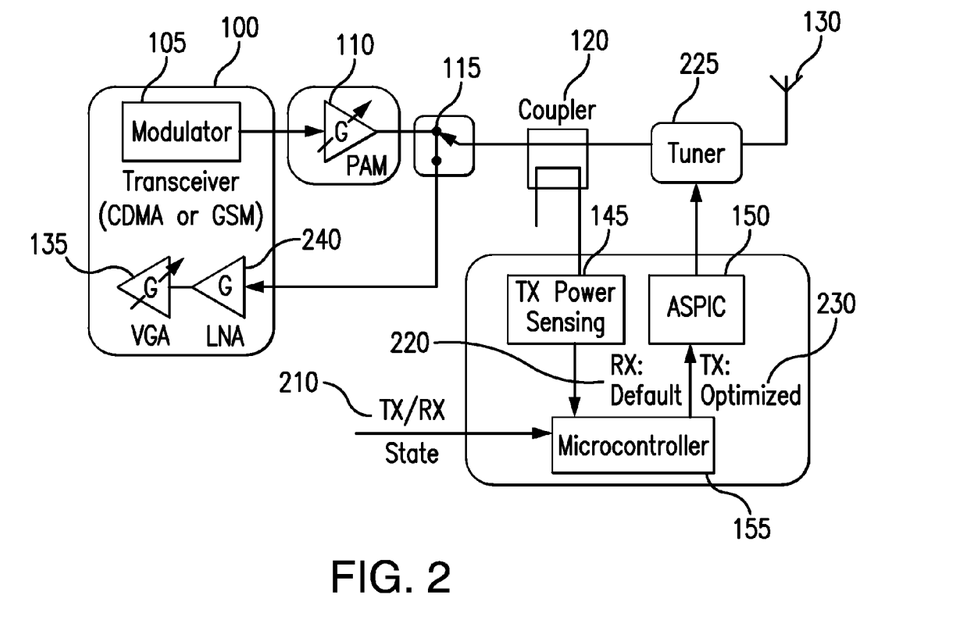
FIG. 2 illustrates an apparatus adapted for transmit and receive one half closed loop power measurements and antenna retuning of an embodiment of the present invention.

Turning now to FIG. 2, a base-band may specify to the microcontroller 155 the transmit and receive state 210. Further, the apparatus of FIG. 2 illustrates the microcontroller may transmit to the ASPIC either a default received state 220 only or an optimized transmit or receive state 230 based on a base-band specification.

Figure 3:
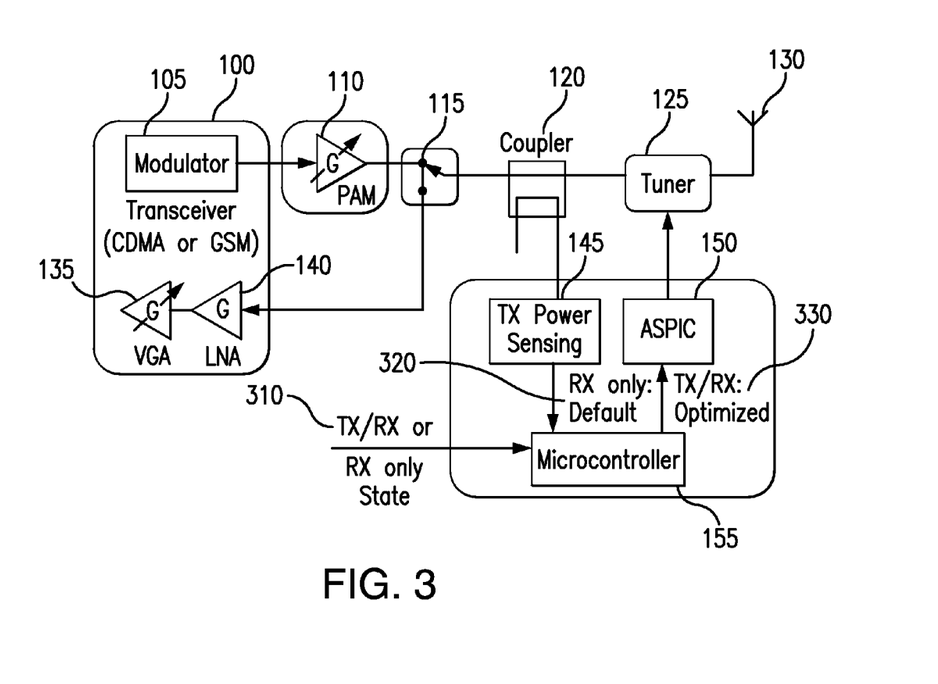
FIG. 3 illustrates an apparatus adapted for transmit and receive three quarters closed loop power measurements and antenna retuning of an embodiment of the present invention.

FIG. 3, illustrates the base-band specifying to the microcontroller the transmit and receive state or receive state only 310. The microcontroller 155 of FIG. 3 may transmit to the ASPIC either a receive default state only 320 or an optimized transmit state based on a base-band specification 330.

Figure 4:
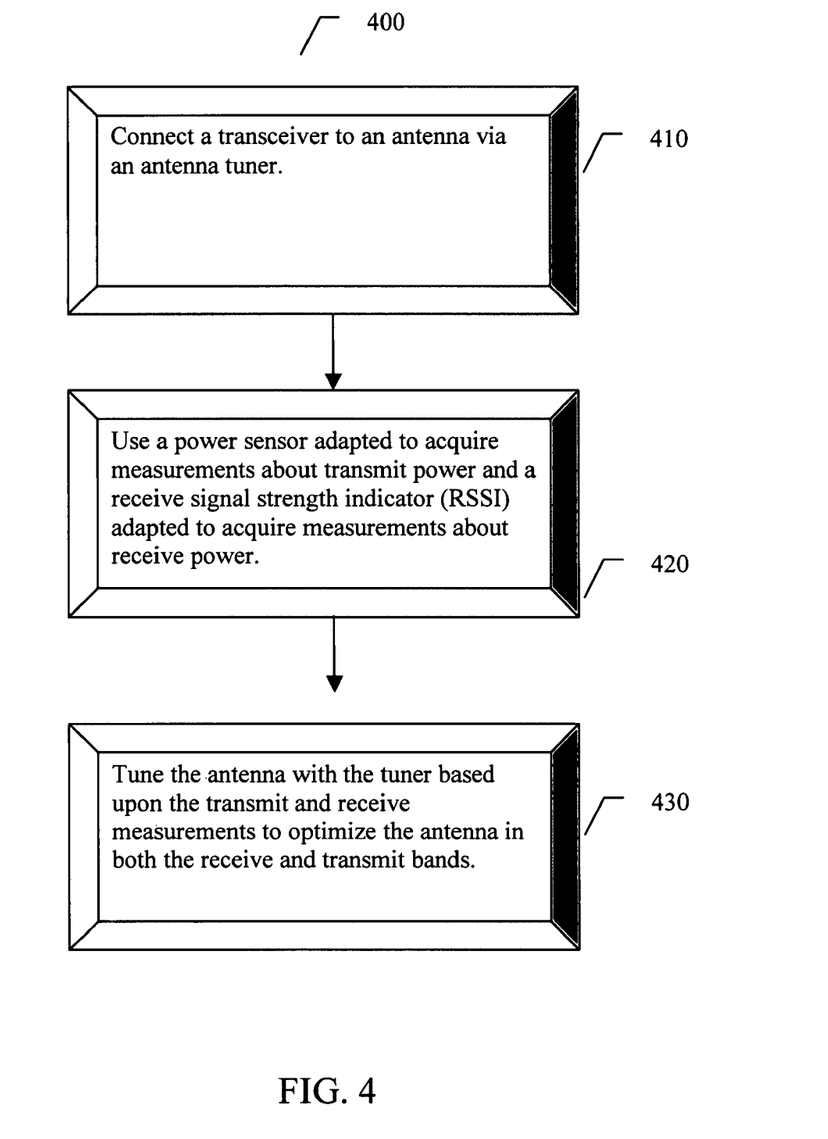
FIG. 4 illustrates a method according to one embodiment of the present invention.

Turning now to FIG. 4, shown generally as 400, is a method according to an embodiment of the present invention, comprising connecting a transceiver to an antenna via an antenna tuner 410, using a power sensor adapted to acquire measurements about transmit power and a receive signal strength indicator (RSSI) adapted to acquire measurements about receive power 420 and tuning the antenna with the tuner based upon the transmit and receive measurements to optimize the antenna in both the receive and transmit bands 430. An embodiment of the present method may further comprise using a modulator driving a power amplifier module (PAM), a low noise amplifier adapted to receive the output of the PAM via a switch and a variable gain amplifier (VGA) receiving the output of the low noise amplifier in the transceiver. Also, the present method may further comprise receiving the output of the VGA by the RSSI and outputting to a processor, thereby providing the receive sense for the receive signal measurements and coupling the output of the PAM via a coupler and switch to the power sensor to determine the transmit measurements. An embodiment of the present method may further comprise using a microcontroller adapted to received transmit measurements from the power sensor and receive measurements from the RSSI via a processor and passing this information to an application specific programmable integrated circuit (ASPIC) to control the tuner.

Specifying by a base-band to the microcontroller the transmit and receive state or specifying by a base-band to the microcontroller the transmit and receive state or receive state only may also be included in some embodiments of the present invention. In still a further embodiment, the present method may further comprise transmitting by the microcontroller to the ASPIC either a default received state only or an optimized transmit or receive state based on a base-band specification.

Some embodiments of the present invention may be implemented, for example, using a machine-readable medium or article which may store an instruction or a set of instructions that, if executed by a machine, for example, by the microcontroller 130 or ASPIC 135 of FIG. 1, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-S oriented, visual, compiled and/or interpreted programming language, e.g., C, C++, Java, BASIC, Pascal, Fortran, Cobol, assembly language, machine code, or the like.

In an embodiment of the present invention the machine-accessible medium that provides instructions, which when accessed, may cause the machine to perform operations comprising connecting a transceiver to an antenna via an antenna tuner, using a power sensor adapted to acquire measurements about transmit power and a receive signal strength indicator (RSSI) adapted to acquire measurements about receive power, and tuning the antenna with the tuner based upon the transmit and receive measurements to optimize the antenna in both the receive and .transmit bands. The machine-accessible medium of the present invention may further comprise the instructions causing the machine to perform operations further comprising using a modulator driving a power amplifier module (PAM), a low noise amplifier adapted to receive the output of the PAM via a switch, and a variable gain amplifier (VGA) receiving the output of the low noise amplifier in the transceiver. The machine-accessible medium of the present invention yet still may further comprise the instructions causing the machine to perform operations further comprising receiving the output of the VGA by the RSSI and outputting to a processor, thereby providing the receive sense for the receive signal measurements and still further comprise the instructions causing the machine to perform operations further comprising coupling the output of the PAM via a coupler and switch to the power sensor to determine the transmit measurements and using a microcontroller adapted to received transmit measurements from the power sensor and receive measurements from the RSSI via a processor and passing this information to an application specific programmable integrated circuit (ASPIC) to control the tuner.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Regarding the timing for retuning, in an embodiment of the present invention the antenna retuning may occur once per frame, before the burst. In this case power is measured and averaged on the previous burst, the calculation of next biasing points is performed and new values are applied for the following burst. This has the advantages of a lot of time to compute, power savings, no transients issues (spurious), fast enough for humans (~100 ms for retuning).

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A wireless communication device, comprising:
   an antenna;
   a transceiver;
   a tunable network coupled with the antenna and the transceiver; and
   a controller coupled with the tunable network,
   wherein the controller obtains first data associated with transmit power,
   wherein the controller obtains second data associated with receive power,
   wherein the tunable network is adjusted for each frame based upon the first and second data to improve performance of the antenna in both receive and transmit bands, and
   wherein both of the first and second data is utilized in determining each adjustment to the tunable network.

2. The wireless communication device of claim 1, further comprising a directional coupler, wherein the tunable network is positioned between the antenna and the directional coupler.

3. The wireless communication device of claim 1, further comprising:
   a modulator driving a power amplifier module (PAM);
   a low noise amplifier adapted to receive an output of the PAM via a switch; and
   a variable gain amplifier (VGA) receiving an output of the low noise amplifier, wherein an output of the VGA is received by an RSSI device and outputted to the controller.

4. The wireless communication device of claim 3, further comprising:
   a coupler and a switch that couple the output of the PAM to the controller to determine the first data.

5. The wireless communication device of claim 1, further comprising an application specific programmable integrated circuit, wherein the controller provides the first and second data to the application specific programmable integrated circuit to control the tunable network.

6. The wireless communication device of claim 5, wherein transmit and receive states are specified to the controller based on a base-band specification.

7. The wireless communication device of claim 5, wherein a receive state without a transmit state is specified to the controller based on a base-band specification.

8. The wireless communication device of claim 5, wherein a default received state is provided by the controller to the application specific programmable integrated circuit.

9. A method, comprising:
   obtaining, by a controller of a communication device, first data associated with transmit power;
   obtaining, by the controller, second data associated with receive power; and
   adjusting, by the controller, a tunable network of the communication device for each frame prior based upon the first and second data to improve performance of an antenna of the communication device in both receive and transmit bands.

10. The method of claim 9, wherein both of the first and second data is utilized in determining each adjustment to the tunable network.

11. The method of claim 9, comprising:
    driving a power amplifier module (PAM) using a modulator;
    receiving an output of the PAM at a low noise amplifier via a switch; and
    receiving an output of the low noise amplifier at a variable gain amplifier (VGA).

12. The method of claim 11, comprising receiving an output of the VGA at an RSSI device.

13. The method of claim 12, comprising coupling the output of the PAM via a coupler and switch to the controller to determine the first and second data.

14. The method of claim 13, wherein the controller comprises an application specific programmable integrated circuit.

15. A communication device comprising:
    a transceiver;
    an antenna;
    a tunable network coupled with the transceiver and the antenna; and
    a controller coupled with the tunable network,
    wherein the controller obtains first data associated with transmit power,
    wherein the controller obtains second data associated with receive power, and
    wherein the tunable network is adjusted for each frame based upon the first and second data to improve performance of the antenna in both receive and transmit bands.

16. The communication device of claim 15, wherein both of the first and second data are utilized in determining each adjustment to the tunable network.

17. The communication device of claim 15, further comprising:
    a modulator driving a power amplifier module (PAM);
    a low noise amplifier adapted to receive an output of the PAM via a switch;
    a variable gain amplifier (VGA) receiving an output of the low noise amplifier; and
    a processor, wherein the output of the VGA is received by the controller and outputted to the processor.

18. The communication device of claim 17, further comprising:
    a coupler and a switch that couples the output of the PAM to the controller to determine the first data.

19. The communication device of claim 15, further comprising a processor, wherein the controller provides the first and second data to an application specific programmable integrated circuit (ASPIC) to control the tunable network.

20. The communication device of claim 19, wherein one of a default received state only or an optimized transmit or receive state based on a base-band specification is provided by the controller to the ASPIC.

* * * * *